United States Patent [19]

Kos

[11] Patent Number: 4,949,848

[45] Date of Patent: Aug. 21, 1990

[54] WAFER CARRIER

[75] Inventor: Robert D. Kos, Victoria, Minn.

[73] Assignee: Fluoroware, Inc., Chaska, Minn.

[21] Appl. No.: 188,312

[22] Filed: Apr. 29, 1988

[51] Int. Cl.$^5$ ............................................. A47G 19/08
[52] U.S. Cl. ...................................... 211/41; 118/500
[58] Field of Search .................... 211/41, 40; 118/500;
206/454; 134/25.4; 312/50; 414/404

[56] References Cited

U.S. PATENT DOCUMENTS

| | | | |
|---|---|---|---|
| D. 221,688 | 8/1971 | Elsfelder | D55/1 |
| 1,764,754 | 6/1930 | Scott . | |
| 1,885,691 | 11/1932 | Dressler . | |
| 2,019,722 | 11/1935 | Neumeyer | 224/48 |
| 2,156,955 | 5/1939 | Page | 129/16 |
| 2,194,828 | 3/1940 | Greaves | 312/92 |
| 2,407,021 | 9/1946 | Langel | 220/23.2 |
| 2,453,030 | 11/1948 | Newman | 211/49 |
| 2,676,729 | 6/1958 | Neville, Jr. et al. | 220/71 |
| 2,729,375 | 1/1956 | Pace | 226/14 |
| 2,774,472 | 12/1956 | Badalich | 206/62 |
| 2,813,633 | 11/1957 | Welling | 211/41 |
| 2,840,256 | 6/1958 | Cobb, Jr. | 220/71 X |
| 3,160,283 | 12/1964 | LaChance | 211/184 |
| 3,294,271 | 12/1966 | Armbruster | 220/71 X |
| 3,348,721 | 10/1967 | Trevarrow, Jr. | 220/71 X |
| 3,365,070 | 1/1968 | Miles | 211/126 |
| 3,394,819 | 7/1968 | Saville | 211/126 |
| 3,442,395 | 5/1969 | Taylor | 211/41 |
| 3,467,242 | 9/1969 | De Rousse | 206/1 |
| 3,473,670 | 10/1969 | Elftmann | 211/41 |
| 3,480,151 | 11/1969 | Schmitt | 211/41 |
| 3,486,631 | 12/1969 | Rodman | 211/41 |

(List continued a next page.)

FOREIGN PATENT DOCUMENTS

| | | |
|---|---|---|
| 0028266 | 5/1980 | European Pat. Off. . |
| GB880072 | 2/1988 | PCT Int'l Appl. . |
| 1334330 | 10/1973 | United Kingdom . |
| 1571306 | 12/1976 | United Kingdom . |

OTHER PUBLICATIONS

Michael L. Osgar Patent Application for WELDING FLUOROPOLYMER PIPE AND FITTINGS; Ser. No. 628,784, Filed 7/9/84.

1974 Silicon Technology Corporation, Bulletin 4102 "Production Information STC Wafer Baskets".

Dec. 1985; Emerson Plastronics; "Silicon Wafer Handling System" Spin Dryer for Silicon-Wafers.

Fluoroware 1986 Catalog.

Ind. Modular Systems Corp. 1 1971; "Loader/Unloader and Sender/Receiver" 6100 Series.

IBM Technical Disclosure Bulletin; vol. 8 No. 11, Apr. 1966; "Wafer Package" by L. Hershoff.

(List continued a next page.)

Primary Examiner—David M. Purol
Assistant Examiner—Sarah A. Lechok
Attorney, Agent, or Firm—Palmatier & Sjoquist

[57] ABSTRACT

A moldable plastic, distortion and warp resistant wafer carrier having an open top for insertion and removal of wafers with opposed upright end walls. Side walls with inner opposed ribs for spacing axially aligned wafers in the carrier are provided wherein one upright end wall is H-shaped with a horizontal indexing bar extending thereacross intermediate the height of the carrier while the other upright end wall is comprised of a center panel and two side panels each oriented at an oblique angle relative to the center panel. The center panel has a planar outer surface with an upright center line and two planar inner surfaces being oriented obliquely to each other at the center line so that the center panel is thinner adjacent the center line than at outer edge portions of the center panel. A transverse outwardly extending upper flange is on each side wall. Each flange has at least two anti-warp indentations adjacent its respective ends to permit the mold to hold the wafer carrier in its originally molded shape as a wafer carrier cools in the mold thereby minimizing the warp of the wafer carrier within the mold.

15 Claims, 3 Drawing Sheets

U.S. PATENT DOCUMENTS

| | | | |
|---|---|---|---|
| 3,487,943 | 1/1970 | Haidegger | 211/71 |
| 3,498,597 | 3/1970 | Roberts et al. | 263/49 |
| 3,501,047 | 3/1970 | Raabe | 220/71 |
| 3,534,862 | 10/1970 | Shambelan | 211/11 |
| 3,645,581 | 2/1972 | Lasch, Jr. et al. | 302/2 R |
| 3,682,083 | 8/1972 | Puente | 211/41 |
| 3,701,558 | 10/1972 | Baker | 294/33 |
| 3,737,282 | 6/1973 | Hearn et al. | 432/6 |
| 3,819,076 | 6/1974 | Oehler | 214/512 |
| 3,828,726 | 8/1974 | Dietze et al. | 118/500 |
| 3,850,296 | 11/1974 | Hirata et al. | 206/334 |
| 3,923,156 | 12/1975 | Wallestad | 206/454 |
| 3,923,191 | 12/1975 | Johnson | 220/94 R |
| 3,926,305 | 12/1975 | Wallestad | 206/73 |
| 3,930,684 | 1/1976 | Lasch, Jr. et al. | 302/2 R |
| 3,939,973 | 2/1976 | Wallestad | 206/328 |
| 3,947,236 | 3/1976 | Lasch, Jr. | 432/11 |
| 3,961,877 | 6/1976 | Johnson | 432/253 |
| 4,043,451 | 8/1977 | Johnson | 206/334 |
| 4,081,099 | 3/1978 | Shead | 220/71 |
| 4,228,902 | 10/1980 | Schulte | 206/454 |
| 4,256,229 | 3/1981 | Lee | 211/41 |
| 4,318,749 | 3/1982 | Mayer | 134/25.4 |
| 4,355,974 | 10/1982 | Lee | 211/41 X |
| 4,359,162 | 11/1982 | Mayer | 312/50 |
| 4,450,960 | 5/1984 | Johnson | 206/334 |
| 4,471,716 | 9/1984 | Milliren | 211/41 X |
| 4,493,418 | 1/1985 | Johnson | 206/454 |
| 4,508,990 | 2/1985 | Essinger | 313/50 |
| 4,511,599 | 4/1985 | Rustomji | 427/66 |
| 4,515,104 | 5/1985 | Lee | 118/500 |
| 4,520,925 | 6/1985 | Johnson | 206/334 |
| 4,557,382 | 12/1985 | Johnson | 206/444 |
| 4,559,535 | 12/1985 | Watkins | 340/793 |
| 4,566,839 | 1/1986 | Butler | 211/41 X |
| 4,570,151 | 2/1986 | Martorano et al. | 340/52 R |
| 4,584,786 | 4/1986 | Georgopulos | 40/448 |
| 4,602,189 | 7/1986 | Panicker | 313/505 |
| 4,613,793 | 9/1986 | Panicker et al. | 315/169.3 |
| 4,679,689 | 7/1987 | Blome | 206/334 |

OTHER PUBLICATIONS

IBM Technical Disclosure Bulletin, vol. 14, No. 10 Mar. 1972.
Emerson Plastronics, Inc.; 12/85; "Throw Away Your Tweezers" pp. 1–3.
Indus. Modular Sys. Corp.; 1971; "Wafer Carriers".
Peninsula Electronics; Mar. 1971; "Automated Application of Photoresist Coatings..."
"Engineering Plastics and Their Commercial Development" Adv. in Chemistry Series 96; Am. Chem. Soc; 1969.
"Engineering Guide to Phenolic Plastics"; Materials Engineering; Jun. 1971.
"How to Avoid Warpage Problems in Injection Molded Parts Plastics Design and Processing"; Jan. 1974.
"Fluoropolymers Now are Tougher and Easier to Process" Materials Engineering; Aug. 1972.
"Versatile Engineering Thermoplastic Combines Dimensional Stability Resistance to Heat and Water".
Materials Engineering 1971.
Plastic Mold Engineering, rev'd. ed., DuBois and Pribble Reinhold Publishing Corporation; pp. 71, 76–77.
"Plastics Technology, Basic Materials and Processes" R. S. Swanson; McKnight Publ. Co., 1965; pp. 157–158, 166.
"Engineering Design for Plastics" Ed. by E. Baer; Reinhold Pub. Corp.; 1964; pp. 1155, 1159, 1171–1173.
"Fundamentals of Tool Design; Am. Soc. of Tool and Manufacturing Engineers", 1962; pp. 299–300.
"Engineering Data for Product Design" Greenwood; McGraw-Hill Book Co., Inc. 1961; pp. 2, 20.
"Plastic Engineering Handbook"; Society of the Plastics Industry, Inc. 3d Ed. 1960; Reinhold Publ. Corp. pp. 301–302 286.
"Dictionary of Terms Parts I and II"; Horner; The Technical Press, London, 8th Ed. 1960; pp. 168, 287.
"Machinery's Handbook", 16th Ed. 1959; pp. 348–410.
"Plastic Engineering Handbook" The Soc. of the Plastics Industry, Inc. Reinhold Pub.; 1954; pp. 421–425.
"Structural Design in Metals" Williams & Harris; McGraw Hill Book Co., Inc., 1948; pp. 96–97.
"Elementary Structural Analysis; Wilbur & Norris; McGraw-Hill Book Company, Inc., 1948; pp. 14–15.
"The Production of Plastics" Kaye; International Textbook Company; 1947; pp. 317, 330—331.
"An Introduction of Engineering Plastics", Brown & Harris, Murray Hill Books, Inc., 1947.
"Applied Plastics Product Design", Davis and Beck; Prentice-Hall, 1946, pp. 48–53.
"Plastics Handbook for Product Engineers", Sasso; McGraw-Hill Book Co., Inc. 1946; pp. 311, 344–345.

(List continued on next page.)

OTHER PUBLICATIONS

"Handbook of Plastics", Simonds & Ellis; Van Nostrand Company, Inc. Aug. 1943; pp. 834, 855.
"Industrial Plastics"; Simonds; Pitman Publishing Corp.; 1939; pp. 286–287; 308–309.
"Hutchinson's Technical Scientific Encyclopedia", Ed. by Tweeney & Shirshov; vol. II; McMillan Co.; 1935; p. 1.
"Plastics Design", Plastics World, 1972; p. 31.
"Structural Foam in Your Future?, It's Closer than You Think!", Plastic World, Apr. 1972, pp. 40–44.
"Sign Savvy Lies Behind Attractive Moldings", Plastics Design, May 1971; pp. 27–28.
"Designers: Remember These FRTP Basics", Plastics World, May 1971; pp. 62–63.
"Plastic Design; Ideas From the Design Board", Plastics World; 1973; p. 31.
"Plastic Production Design", Beck; Van Nostrand Reinhold Company; 1970; pp. 18–21; 89–185; 345–361.
"Modern Industrial Plastics", Richardson; Howard W. Sams & Co., Inc., 1974; pp. 116–126.
"Tool Engineers Handbook", 1959; pp. 47-49–47.11.
"Design Guidelines for Injection–Molded FEP Parts", Journal of Teflon; Apr. 1966; vol. 7, No. 3, pp. 1–5.
"How to Avoid Warpage Problems in Injection Molded Parts", 1974 Plastics Design & Processing, pp. 25–27.

WAFER CARRIER

BACKGROUND OF THE INVENTION

This invention relates to moldable plastic wafer baskets or carriers for silicon wafers which are designed for carrying and storing silicon wafers used in the production of integrated circuit chips.

The processing of wafers requires that they be successively immersed or sprayed with liquids and gases. Some of the chemical baths include various corrosive chemicals while certain of the baths are extremely hot, in the range of 180° C. Wafers that are presently being processed have diameters as large as 8 inches. Typically, 25 of such wafers are within a single wafer basket or carrier which requires that a carrier be large enough for this capacity. Such a carrier which is full of wafers will weigh eight to ten pounds. Ten inch wafers are now starting to be used and will be in common use in the foreseeable future.

Accordingly, the wafer carriers used to hold the silicon wafers during processing are formed of moldable plastic which preferably is inert and highly resistent to the corrosive effect of chemicals used, and highly resistive to the high bath temperatures regularly employed during the processing. Conventionally, the molded plastic used in carriers is PFA Teflon ®(a registered trademark of E. I. du Pont de Nemours Company), a perfluoroalkoxy-substituted polytetrafluoroethylene resin. For less harsh environments and for wafer storage and shipping, carriers have been made of polypropylene.

It should be recognized that the silicon wafers are extremely delicate and brittle and may be only a few thousandths of an inch thick. The silicon wafers are extremely valuable and breakage of a wafer may represent a significant loss. Particulate and other contamination of wafers must also be avoided in order to manufacture integrated circuit chips operable within the range of standards set by the industry. Thus, there has been an increase in automated handling away from manual handling of the silicon wafers and carriers. Robotic arms are increasingly being utilized for handling both the wafer carrier and the individual silicon wafers where possible.

Automated handling of silicon wafers and wafer carriers require that the envelope of space within a carrier wherein a particular silicon wafer is to be located must be maintained within close tolerances. This is necessary to avoid wafer breakage. Problems have been encountered in handling these large but thin silicon wafers because the wafer carriers have been known to soften and distort when exposed to 180° C. temperatures. Also, warping of the wafer carriers during their cooling down period after injection molding has also been known to occur. Such warping, distorting and bowing of the wafer carriers tends to put added compressive pressure on the edges of the delicate wafers. Therefore, a moldable plastic, distortion and warp resistent wafer carrier is highly desirable for processing, carrying and storing silicon wafers.

SUMMARY OF THE INVENTION

A moldable plastic, distortion and warp resistent wafer carrier having an open top for insertion and removal of wafers with opposed upright end walls. Side walls with inner opposed ribs for spacing axially aligned wafers in the carrier are provided wherein one upright end wall is H-shaped with a horizontal indexing bar extending thereacross intermediate the height of the carrier while the other upright end wall is comprised of a center panel and two side panels each oriented at an oblique angle relative to the center panel. The center panel has a planar outer surface with an upright center line and two planar inner surfaces being oriented obliquely to each other at the center line so that the center panel is thinner adjacent the center line than at outer edge portions of the center panel. A transverse outwardly extending upper flange is on each side wall. Each flange has at least two anti-warp indentations adjacent its respective ends to permit the mold to hold the wafer carrier in its originally molded shape as a wafer carrier cools in the mold thereby minimizing the warp of the wafer carrier within the mold.

A principal objective of this invention is to provide a wafer carrier that remains in its original shape when formed within the mold free of warpage as it cools during its solidification.

Another object of this invention is to provide a wafer carrier that is highly resistant to distortion and warpage when exposed to extreme temperatures and caustic baths common to the processing steps of silicon wafers.

Another objective of this invention is to provide a wafer carrier which will readily permit safe automated process handling of the wafer carrier and silicon wafers therein by robotic or mechanical arms without undue wafer breakage specifically due to the minimal dimensional deviations of the wafer carrier from the specified tolerances.

DETAILED SPECIFICATION OF THE INVENTION

Figures 1, 2:
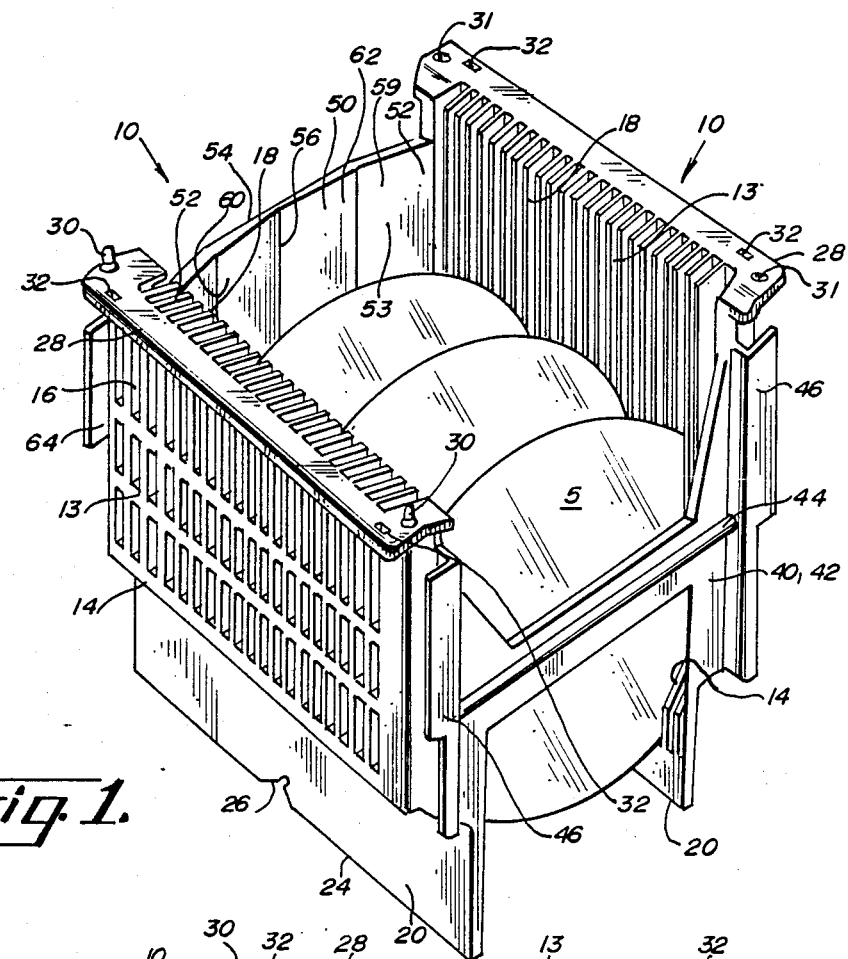
FIG. 1 is a perspective view of the wafer carrier of the invention carrying silicon wafers.
FIG. 2 is a top view of the wafer carrier.
Figure 3:
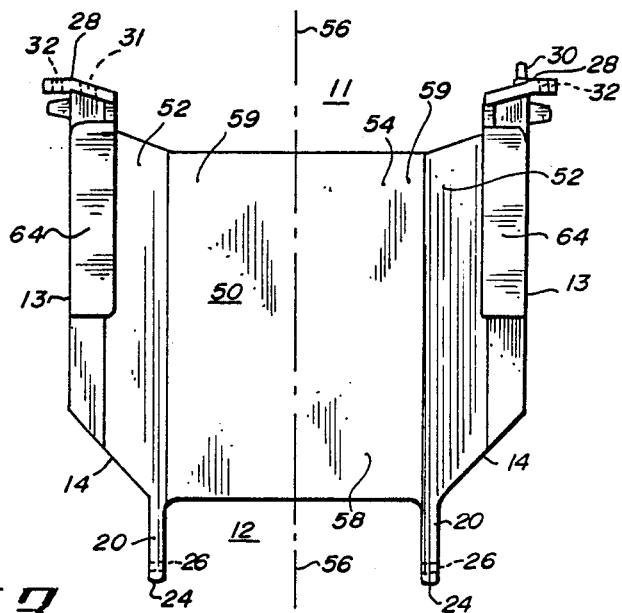
FIG. 3 is a rear elevational view of the wafer carrier.
Figure 4:
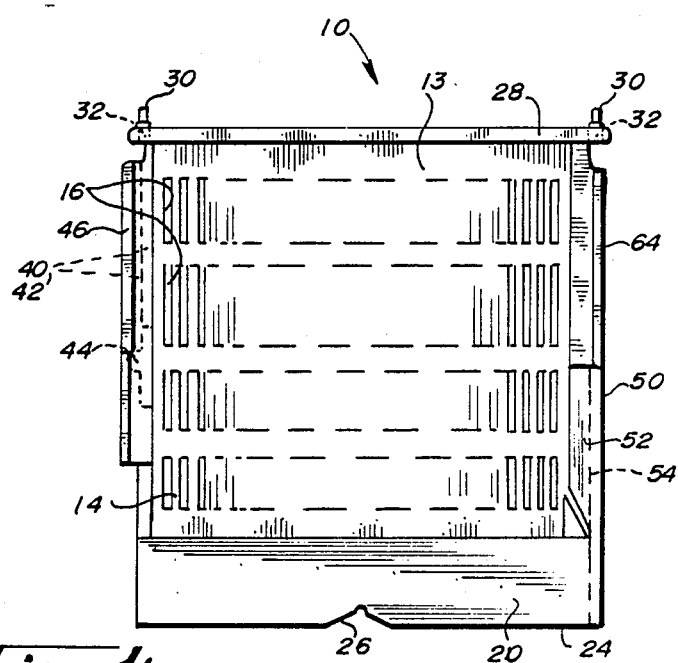
FIG. 4 is a side elevational view of the wafer carrier.
Figure 5:
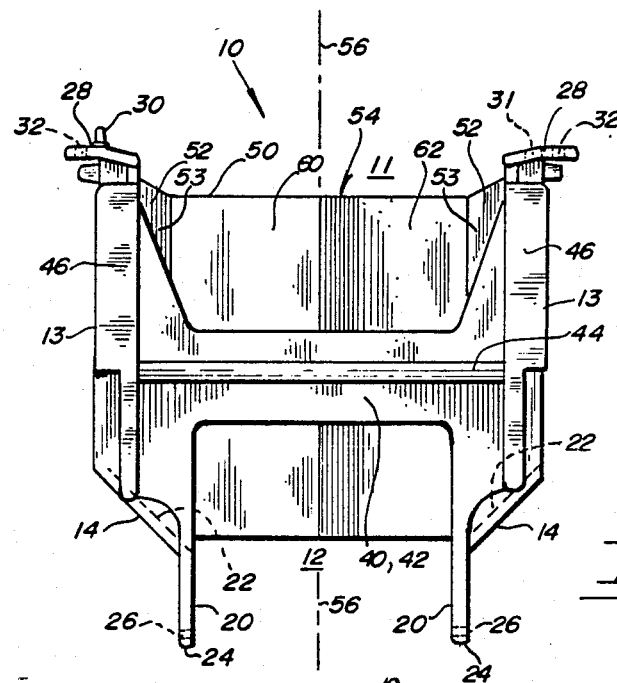
FIG. 5 is a front elevational view of the wafer carrier.
Figure 6:
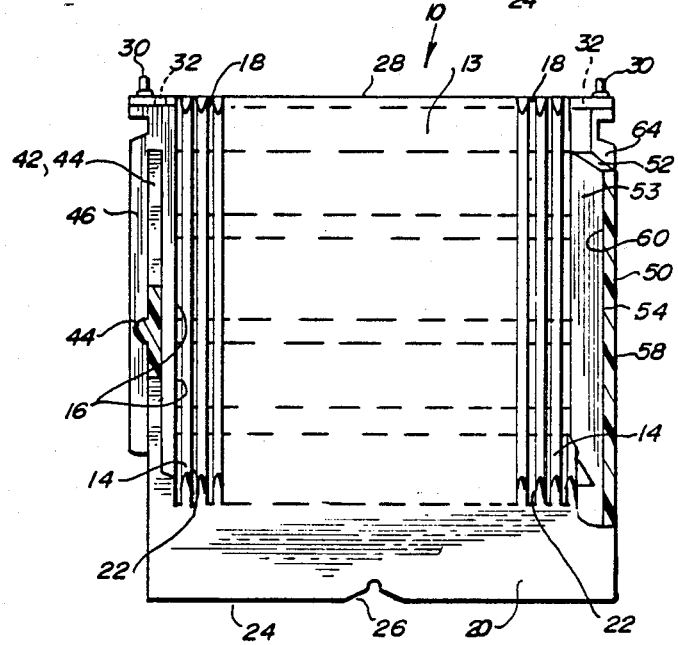
FIG. 6 is a view of the wafer carrier taken along lines 6—6 of FIG. 2.

Referring to FIGS. 1-6, the wafer carrier with silicon wafers 5 of the present invention may be seen and is generally referred to by reference numeral 10. Wafer carrier 10 is suitably injection molded integrally in one piece fashion appropriately out of plastic as previously mentioned.

Wafer carrier 10 has an open top 11 and an open bottom 12. Upright sidewalls 13, which are mirror images of each other, each have opposing lower offset inwardly wall portions 14 with windows, cutaways or wash slots 16 throughout sidewalls 13 to cooperate with open top 11 and open bottom 12 to improve the application, disbursement, rinsing and other flow of liquids through the wafer carrier 10 and over wafers 5. Wafers 5 are held in place by opposing and inwardly projecting ribs 18 which are aligned to permit wafers 5 to be carried by wafer carrier 10 in axial alignment with predetermined space between each wafer 5.

Tapered foot panels 20 are substantially parallel with respect to each other being along and below offset portions 14 of sidewalls 13. The top surfaces 22 of the tapered foot panels 20 comprise the wafer support surface 22. By this arrangement, there is minimal contact with the peripheral edges of the wafers 5. The bottom surface 24 of tapered foot panels 20 has a centrally located locating notch 26 which permits indexing or properly aligning the wafer carrier 10 on or in a particular piece of machinery. The bottom surfaces 24 convergently taper upwardly from both ends of the respective panels 20 towards the locating notch 26. By this design, tapered foot panels 20 act as four independent feet.

Each upper sidewall 13 also has a transverse outwardly extending upper flange 28. While one flange 28 on one sidewall 13 has upwardly protruding pins 30, the other flange 28 on other sidewall 13 has slots or holes 31 for receiving pins 30. The pins 30 and holes 31 arrangement permit a dump-transfer of wafers 5 into or from another wafer carrier 10 of similar size. Located distally or at the respective ends of flange 28 are anti-warp indentations 32 which suitably may be holes, notches or depressions which suitably permit gripping of the wafer carrier 10 by the mold as the wafer carrier begins to cool when the liquid plastic begins to solidify.

Wafer carrier 10 has an H-shaped end wall 40 with an H-shaped flange 42 supporting a horizontal indexing bar 44 commonly used for indexing the wafer carrier 10 in or on a piece of machinery. Robotic pickup flanges 46 are also provided at the juncture of end wall 40 and sidewalls 13 to permit robotic handling of wafer carrier 10.

Three panel end wall 50 opposes H-shaped end wall 40 and consists of side panels 52 and central panel 54. Central panel 54 has an upright center line 56 along which is the thinnest portion of end wall 50. Center panel 54 also a planar outer surface 58 with outer edge portions 59 adjacent side panels 52. Center panel 54 also has a first planar inner surface 60 and a second planar inner surface 62 oblique to each other and each adjacent center line 56. End wall 50 also suitably may have robotic pickup flanges 64 similar to robotic pickup flanges 46.

Remembering that the principal objects of this invention are a moldable plastic, distortion and warp resistant wafer carrier, the novel features of the present invention may now be appreciated.

After the molten plastic has been completely injected into the mold to cast the wafer carrier 10, the plastic begins to change from liquid to solid. Firstly, the molten plastic forms a skin while the inner portions of the wafer carrier 10 are still molten. This chemical change has been found to cause stress within molded carriers. The thicker the particular section wafer carrier is typically associated with greater internal stresses at that location due to a longer setting up and cooling period.

Consequently, as wafer carrier 10 begins to solidify within its mold, stresses due to the chemical change going from a molten state to a solid state may act upon wafer carrier 10 in a manner that upper sidewalls 13 and end walls 40 and 50 may begin to pull away from the inner surface of the mold as the wafer carrier 10 cools and solidifies in the mold.

If the mold has some protruding element such as pins, in the area of upper flanges 28 to form and fit anti-warp indentations or holes 32, the mold will effectively hold the wafer carrier 10 in its original position as it changes from a molten to a solid state thereby minimizing the chance of warp and increasing the possibilities that the wafer carrier 10 will remain in its originally molded and specified condition.

It has generally been past practices to mold wafer carriers out of plastic having a uniform wall thickness. However, the thicker wall portions create more internal stresses due to the required longer cooling period to thereby permit the plastic to set up from a molten to a solid state. Such carriers are more susceptible to distortion, warpage and bowing. Consequently, the thinning of the wall portions of end wall 50 minimizes internal stresses which may later cause the wafer carrier to distort or warp due to its expected exposure to hot chemical baths.

Three panel end wall 50 has a varied thickness with a thinning towards the center line 56. Additionally, end wall 50 essentially has four inner planar surfaces 53, 53 and 60, 62 of the respective side panels 52 and center panel 54. This angularity alone with respect to three panel end wall 50 further adds rigidity, and warp and distortion resistance to wafer carrier 10.

The present invention may be embodied in other forms without departing from the spirit or essential attributes thereof, therefore the illustrated embodiments should be considered in all respects as illustrative and not restrictive, reference being made to the appended claims rather than to the foregoing description to indicate the scope of the invention.

What is claimed:

1. A moldable plastic, distortion and warp resistant wafer carrier having an open top for insertion and removal of wafers, an open bottom, a pair of opposed upright end walls, and a pair of opposed upright side walls with inner, opposed ribs for spacing axially aligned wafers in the carrier, one said upright end wall being H-shaped with a horizontal indexing bar extending thereacross intermediate the height of the carrier, the other upright end wall comprised of a center panel and two side panels each oriented at an oblique angle relative to the center panel, the center panel having a planar outer surface with an upright center line and two planar inner surfaces being oriented obliquely to each other at the center line so that the center panel is thinner adjacent the center line than at outer edge portions of the center panel thereby adding rigidity to the wafer carrier while minimizing warp stress in the wafer carrier and preventing the other upright end wall from distorting or bowing inwardly when the wafer carrier is subjected to high temperatures or caustic chemicals.

2. The wafer carrier of claim 1, wherein the side panels of the other upright end wall extend outwardly.

3. The wafer carrier on claim 1, further comprising a pair of upright parallel tapered foot panels along and below the side walls each having a bottom surface which convergently tapers upwardly from both ends of the edge.

4. The wafer carrier of claim 3, further comprising a centrally located indexing notch on the bottom surface of the tapered foot panels.

5. The wafer carrier of claim 1, wherein each side wall has lower inwardly offset wall portions.

6. A moldable plastic, distortion and warp resistant wafer carrier to be made in a mold having an open top for insertion and removal of wafers, an open bottom, a pair of opposed side walls with inner, opposed ribs for spacing axially aligned wafers in the carrier, a pair of opposed upright end walls wherein one upright end wall is H-shaped with a horizontal indexing bar extending thereacross intermediate the height of the carrier and having a transverse outwardly extending upper flange with an outer edge on each sidewall extending along the length thereof each said upper flange having at least two anti-warp indentations extending inwardly and separate from the other edge of said upper flange one each adjacent said upper flange's respective ends to permit the mold to hold the wafer carrier in its originally molded shape as the wafer carrier cools in the mold thereby minimizing warp when the wafer carrier is cooling and soldifying within the mold.

7. The wafer carrier of claim 6 wherein the anti-warp indentations are holes through the flange.

8. The wafer carrier of claim 6, further comprising a pair of upright parallel tapered foot panels along and below the side walls each having a bottom surface which convergently tapers upwardly from both ends of the edge.

9. The wafer carrier of claim 8, further comprising a centrally located indexing notch on the bottom surface of the tapered foot panels.

10. The wafer carrier of claim 6, wherein each sidewall has lower inwardly directed offset wall portions.

11. A moldable plastic, distortion and warp resistant wafer carrier to be made in a mold having an open top for insertion and removal of wafers, an open bottom, a pair of opposed upright end walls, one said upright end wall being H-shaped with a horizontal indexing bar extending thereacross intermediate the height of the carrier, a pair of opposed upright side walls, with inner, opposed ribs for spacing axially aligned wafers in the carrier, the other upright end wall comprised of a center panel and two side panels each oriented at an oblique angle relative to the center panel, the center panel having a planar outer surface with an upright center line and two planar inner surfaces being oriented obliquely to each other at the center line so that the center panel is thinner adjacent the center line than at outer edge portions of the center panel thereby adding rigidity to the wafer carrier while minimizing warp stress in the wafer carrier and preventing the other upright end wall from distorting or bowing inwardly when the wafer carrier is subjected to high temperatures or caustic chemicals and further having a transverse outwardly extending upper flange on each sidewall extending along the length thereof, each flange having at least two anti-warp indentations one each adjacent said upper flange's respective ends to permit the mold to hold the wafer carrier in its originally molded shape as the wafer carrier cools in the mold thereby minimizing warp when the wafer carrier is cooling and solidifying within the mold.

12. The wafer carrier of claim 11, wherein the side panels of the other upright end wall extend outwardly.

13. The wafer carrier of claim 11, further comprising a pair of upright parallel tapered foot panels along and below the side walls each having a bottom surface which convergently tapers upwardly from both ends of the edge.

14. The wafer carrier of claim 13, further comprising a centrally located indexing notch on the bottom surface of the tapered foot panels.

15. The wafer carrier of claim 11, wherein each sidewall has lower offset inwardly directed wall portions.

* * * * *